(12) United States Patent
Lao et al.

(10) Patent No.: US 7,002,796 B2
(45) Date of Patent: Feb. 21, 2006

(54) COMPUTER COMPONENT MOUNTING SYSTEM

(75) Inventors: Patrick Lao, Macao (MO); Yuan-Lin Hsu, Tu-chen (TW); Li Ping Chen, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 263 days.

(21) Appl. No.: 10/681,391

(22) Filed: Oct. 7, 2003

(65) Prior Publication Data

US 2004/0201962 A1    Oct. 14, 2004

(30) Foreign Application Priority Data

Apr. 11, 2003    (TW) ............................... 92205663 U

(51) Int. Cl.
*H05K 7/20* (2006.01)
(52) U.S. Cl. .................. 361/695; 361/683; 361/685; 361/697; 361/687; 361/732; 361/740; 361/747; 361/756; 361/802; 165/121; 165/122; 312/298
(58) Field of Classification Search ............... 361/683, 361/685, 695, 697, 721–727, 692, 732, 740, 361/747, 756, 802; 165/104, 33, 185, 121, 165/122; 312/298, 350, 138.1; 454/184
See application file for complete search history.

(56) References Cited

U.S. PATENT DOCUMENTS

| | | | |
|---|---|---|---|
| 5,079,438 A * | 1/1992 | Heung | 307/141 |
| 5,793,608 A * | 8/1998 | Winick et al. | 361/695 |
| 6,115,250 A * | 9/2000 | Schmitt | 361/695 |
| 6,181,565 B1 * | 1/2001 | Schmitt et al. | 361/756 |
| 6,244,953 B1 | 6/2001 | Dugan | |
| 6,288,897 B1 * | 9/2001 | Fritschle et al. | 361/687 |
| 6,335,868 B1 * | 1/2002 | Butterbaugh et al. | 361/796 |
| 6,411,511 B1 * | 6/2002 | Chen | 361/697 |
| 6,735,091 B1 * | 5/2004 | Megason et al. | 361/801 |
| 6,738,261 B1 * | 5/2004 | Vier et al. | 361/740 |

FOREIGN PATENT DOCUMENTS

TW    313279    8/1997

\* cited by examiner

*Primary Examiner*—Michael Datskovskiy
(74) *Attorney, Agent, or Firm*—Wei Te Chung

(57) ABSTRACT

A computer component mounting system includes two mounting frames (30) attached to two side panels (52) of a chassis (50) respectively, and a mounting bracket (10) having a main portion (12) for attaching computer components (100) such as fans (100) thereto, and two mounting portions (13) at opposite ends of the main portion. Each mounting frame includes a base plate (32) forming a positioning plate (322), and two side plates (36) each forming an oblique guide plate (362). A locking slot (364) is defined in each side plate and adjoining guide plate. Each mounting portion includes two locking tabs (140, 160) engaging in the locking slots of a corresponding mounting frame, and a positioning tab (15) joined to the positioning plate of the corresponding mounting frame to thereby secure the mounting bracket to the mounting frames. The fans are thus secured within the chassis.

20 Claims, 5 Drawing Sheets

COMPUTER COMPONENT MOUNTING SYSTEM

BACKGROUND OF THE INVENTION

1. Field of the Invention

The present invention relates to component mounting systems, and particularly to a computer component mounting system incorporating guide structures for facilitating assembly thereof.

2. Related Art

Modern high-speed central processing units (CPUs) generate copious amounts of heat which needs to be efficiently dissipated. A typical computer system incorporating a CPU often includes one or more fans to cool the CPU.

Taiwan Pat. Pub. No. 313279 discloses a mounting structure capable of mounting a plurality of fans within a computer enclosure. The mounting structure comprises a main body. A plurality of catch means is formed on a central portion of the main body, for holding the fans thereon. A plurality of spring fingers and clips is formed on a periphery of the main body, for attaching the mounting structure to a rear panel of the enclosure. The mounting structure has the following shortcomings. Firstly, the rear panel must have a plurality of engaging means corresponding to the plurality of spring fingers, clips and catches of the mounting structure. This makes a structure of the enclosure unduly complicated. Secondly, in assembly, the spring fingers, clips and catches of the mounting structure are required to be accurately aligned with the corresponding engaging means of the rear panel prior to inter-engagement therebetween. This reduces an efficiency of assembly. Thirdly, the mounting structure can be only attached to the rear panel of the enclosure. Thus, the mounting structure can only position the fans adjacent a rear portion of the enclosure. If CPU is located in a position other than the rear portion, the efficacy of the fans is reduced.

U.S. Pat. No. 6,244,953 discloses a mounting bracket for a single fan. The fan is received in the bracket, and the combined fan and bracket is readily hung on a rear panel of an enclosure. However, the mounting bracket can install only one fan on the rear panel. When several fans need to be installed, several mounting brackets need to be hung one by one. This is unduly costly and laborious.

Thus, a new mounting apparatus for a fan which overcomes the above-mentioned problems is desired.

SUMMARY OF THE INVENTION

Accordingly, an object of the present invention is to provide a computer component mounting system for readily attaching one or more computer components such as fans within a chassis.

Another object of the present invention is to provide an inexpensive computer component mounting system capable of mounting a plurality of computer components such as fans at one time.

To achieve the above-mentioned objects, a computer component mounting system in accordance with a preferred embodiment of the present invention comprises a chassis having a pair of opposite side panels, a pair of mounting frames attached to insides of the side panels respectively, and a mounting bracket for holding one or more computer components such as fans. Each mounting frame comprises a base plate, and a pair of side plates extending from opposite sides of the base plate. A positioning plate extends perpendicularly from a top edge of the base plate. A pair of symmetrically diverging guide plates extends upwardly obliquely from top edges of the side plates. A locking slot is defined in each side plate and adjoining guide plate. The mounting bracket comprises a main portion for holding the fans, and a pair of mounting portions at opposite ends of the main portion. Each mounting portion comprises a pair of locking tabs corresponding to the locking slots of a corresponding mounting frame, and a positioning tab corresponding to the positioning plate of the corresponding mounting frame. The locking tabs of the mounting bracket are engaged in the locking slots of the corresponding mounting frame respectively, and the positioning tabs of the mounting portions and the mounting frames are joined together, thereby securing the mounting bracket to the mounting frames. The fans are thus secured within the chassis.

Other objects, advantages and novel features of the present invention will be drawn from the following detailed description of the preferred embodiment of the present invention with the attached drawings, in which:

DESCRIPTION OF THE PREFERRED EMBODIMENTS

Figure 1:
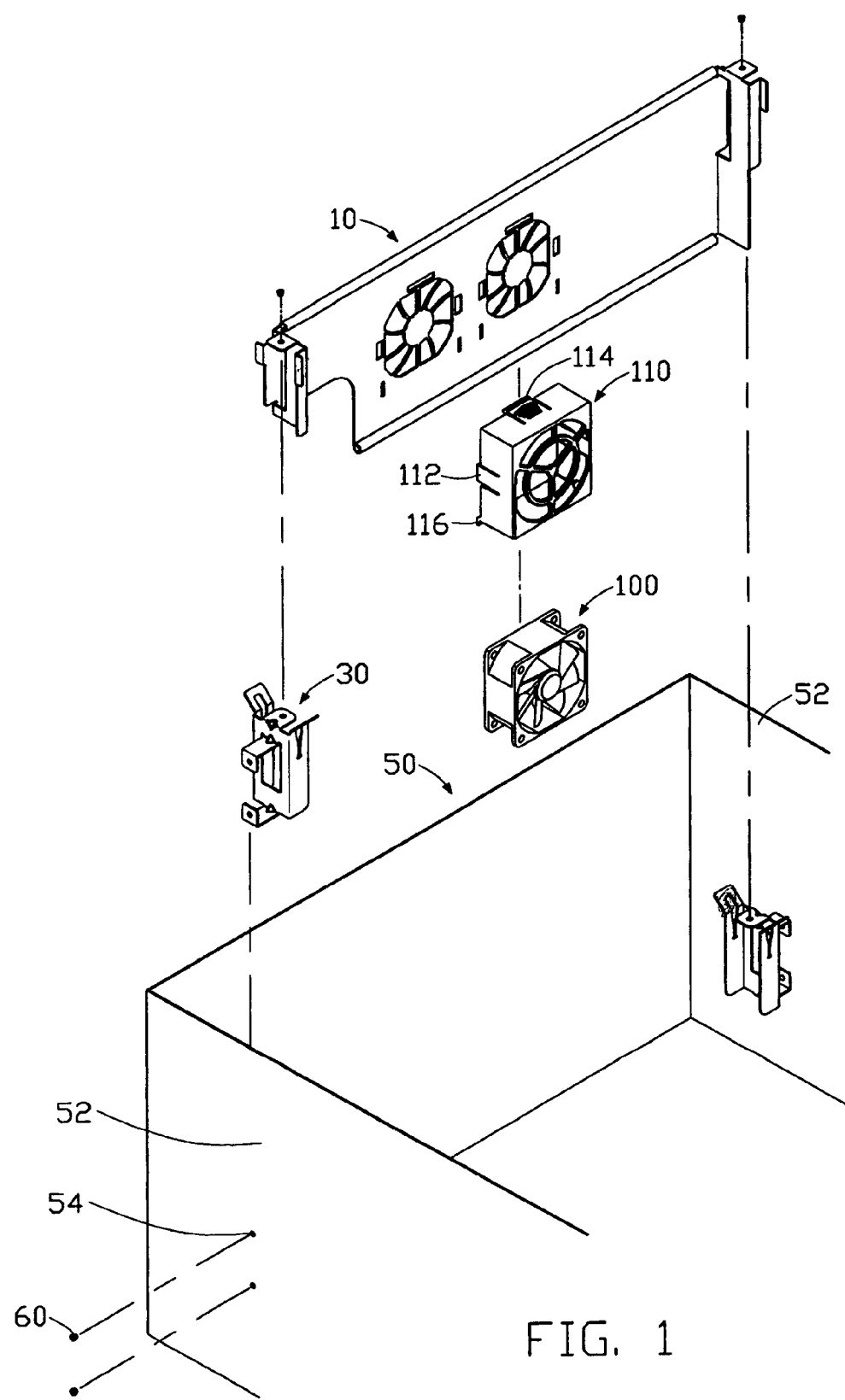
FIG. 1 is an exploded, isometric view of a computer component mounting system in accordance with the preferred embodiment of the present invention, together with a fan and a fan housing.
Figure 2:
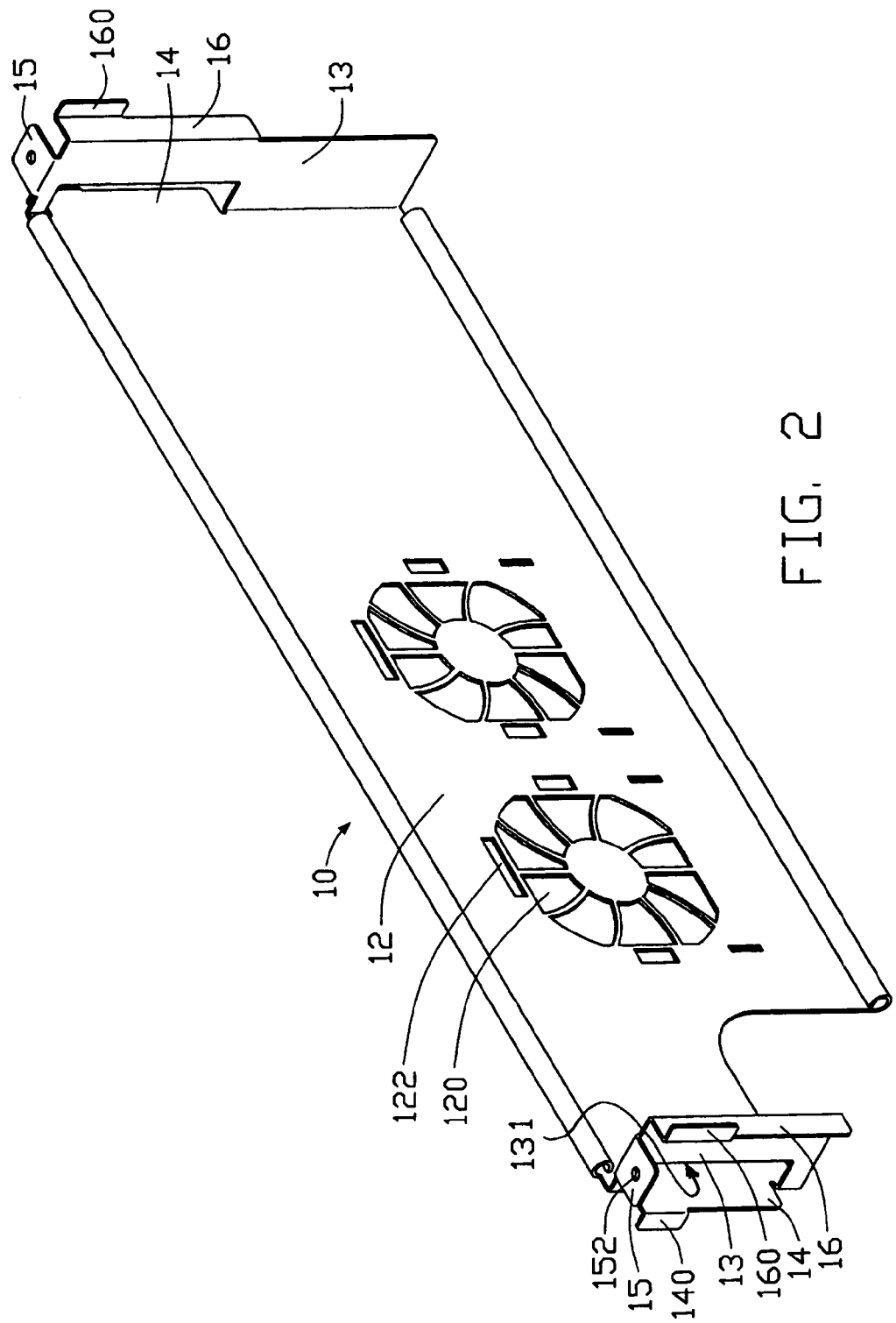
FIG. 2 is an enlarged view of a mounting bracket of the mounting system of FIG. 1.
Figure 3:
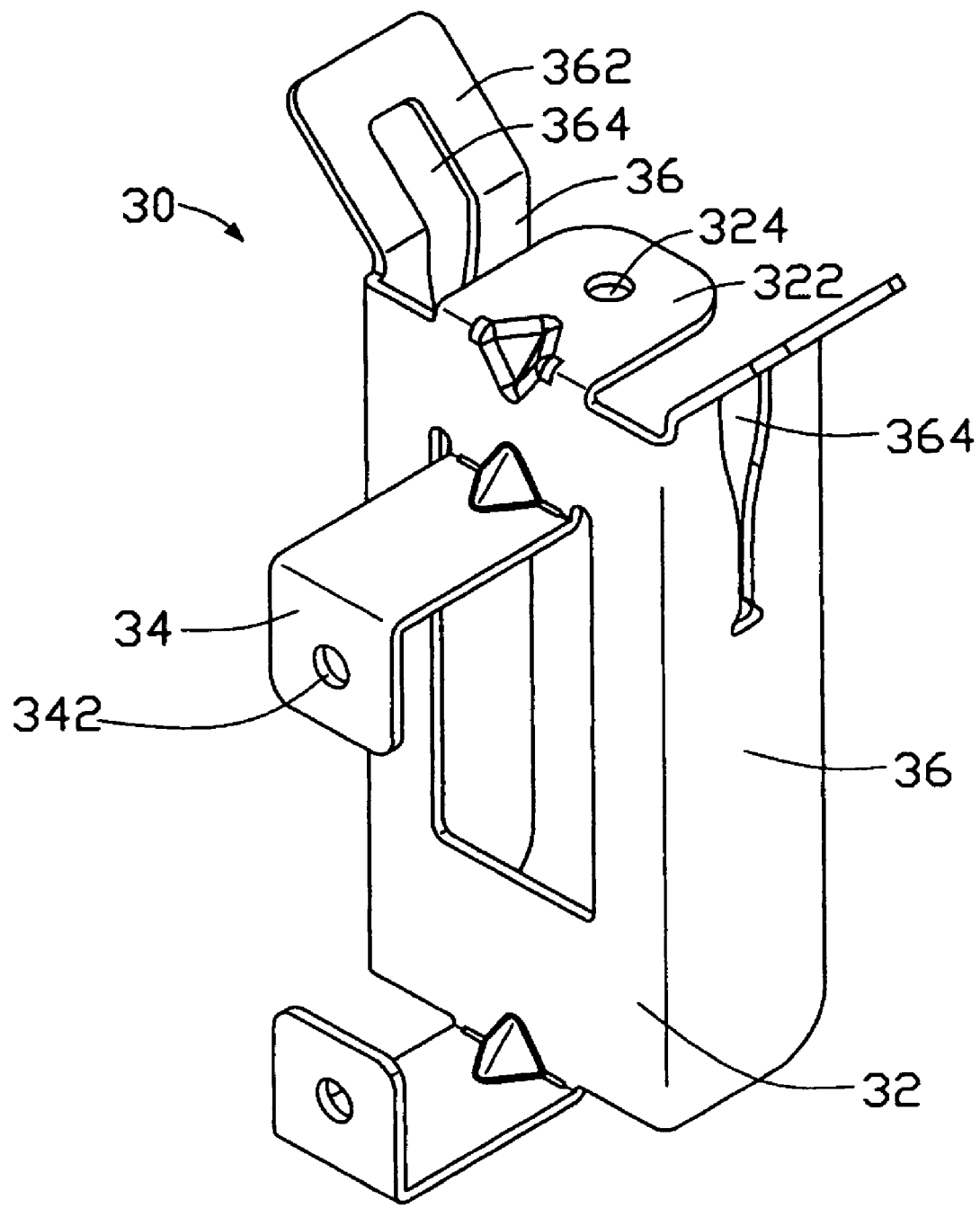
FIG. 3 is an enlarged view of one mounting frame of the mounting system of FIG. 1.

Referring to FIGS. 1 through 3, a computer component mounting system of the present invention is for mounting one or more computer components such computer fans 100 (only one shown). A preferred embodiment of the mounting system comprises a mounting bracket 10 for holding the fans 100, a chassis 50 having two opposite side panels 52, and two mounting frames 30 attached to the side panels 52 respectively.

The mounting bracket 10 comprises a flat main portion 12, and two mounting portions 13 formed at opposite ends of the main portion 12 respectively. The main portion 12 is used for holding the fans 100 thereon. A plurality of air openings 120 (only two air openings 120 are illustrated in FIG. 1) is defined in the main portion 12. A plurality of mounting slots 122 is defined in the main portion 12 around each air opening 120. In the preferred embodiment, three mounting slots 122 are defined around an upper portion of each air opening 120, and two mounting slots 122 are defined below each air opening 120.

Each mounting portion 13 comprises first and second parallel plate portions 14, 16 at opposite rear and front sides thereof respectively. The first plate portion 14 extends coplanarly from a corresponding end of the main portion 12, and the second plate portion 16 is bent perpendicularly from a front side of the mounting portion 13. In fact, the first plate portion 14 essentially split from the mounting portion 13 with an opening 131 left therein. A first vertical locking tab 140 extends perpendicularly rearwardly from an outer side edge of the first plate portion 14. A second vertical locking tab 160 extends perpendicularly forwardly from an outer side edge of the second plate portion 16. A horizontal positioning tab 15 extends perpendicularly outwardly from a top edge of the mounting portion 13. A positioning hole 152 is defined in the positioning tab 15.

Each mounting frame 30 comprises a base plate 32, and two parallel side plates 36 extending perpendicularly from opposite sides of the base plate 32 respectively. The base plate 32 and side plates 36 cooperatively define a space therebetween for receiving a corresponding mounting portion 13 of the mounting bracket 10. A distance between the side plates 36 is substantially equal to a distance between the first and second plate portions 14, 16 of the mounting portion 13, so that the mounting portion 13 can be fittingly received in said space. A positioning plate 322 extends perpendicularly inwardly from a top edge of the base plate 32, corresponding to the positioning tab 15 of the mounting portion 13. A positioning hole 324 is defined in the positioning plate 322. A pair of L-shaped mounting plates 34 extends outwardly from the base plate 32, for attachment to a corresponding side panel 52. Each mounting plate 34 defines a mounting hole 342 in an end portion thereof. A pair of screw holes 54 is defined in each side panel 52, corresponding to the mounting holes 342 of a respective mounting plate 34. The mounting system further comprises two pairs of screws 60, for extension through the mounting holes 342 and screw holes 54 to thereby fasten the mounting frames 30 to the side panels 52 respectively.

A pair of symmetrically diverging guide plates 362 extends obliquely upwardly from top edges of the side plates 36 respectively. One of the guide plates 362 extends upwardly and rearwardly, and the other guide plate 362 extends upwardly and forwardly. The guide plates 362 are for guiding the mounting portion 13 into said space of the mounting frame 30. A locking slot 364 is defined in each side plate 36 and adjoining guide plate 362, for receiving the first and second locking tabs 140, 160 of the mounting portion 13 therein. The locking slot 364 progressively tapers, with a width of an upper portion of the locking slot 364 being greater than a width of a lower portion thereof. The width of the lower portion of the locking slot 364 is substantially equal to a thickness of a corresponding first locking tab 140 or second locking tab 160.

A fan housing 110 is provided for receiving the fan 100 therein. The housing 110 is made of resilient material such as plastic. Three spring fingers 112 extend from three adjoining peripheral walls of the housing 110 respectively, corresponding to the three mounting slots 122 that are around the upper portion of a respective air opening 120. A protrusion 114 is outwardly formed on an end of each spring finger 112. A pair of clips 116 depends from bottom corners of the housing 110 respectively, corresponding to the two mounting slots 122 that are below the air opening 120.

Figure 4:
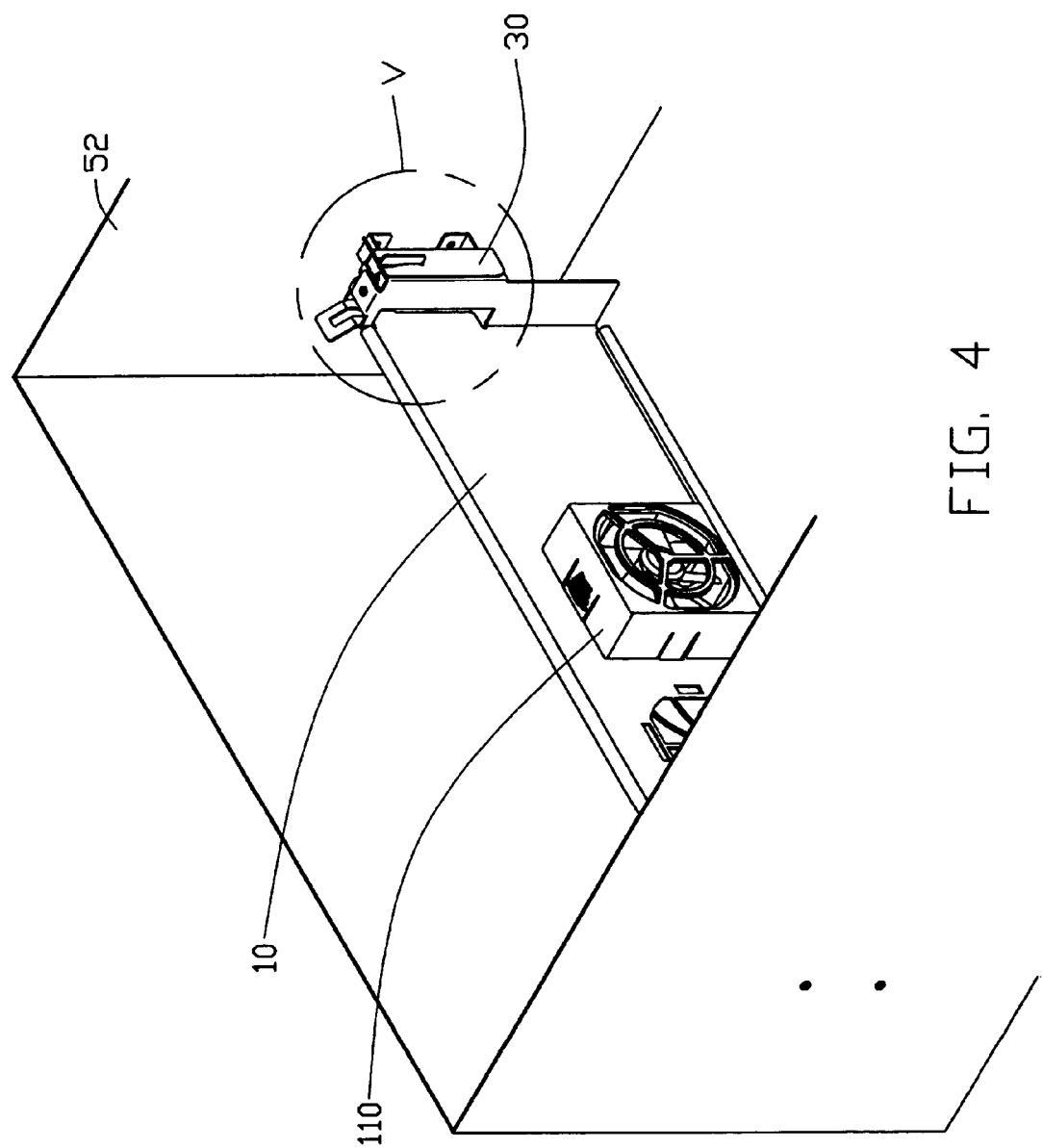
FIG. 4 is an assembled view of FIG. 1.
Figure 5:
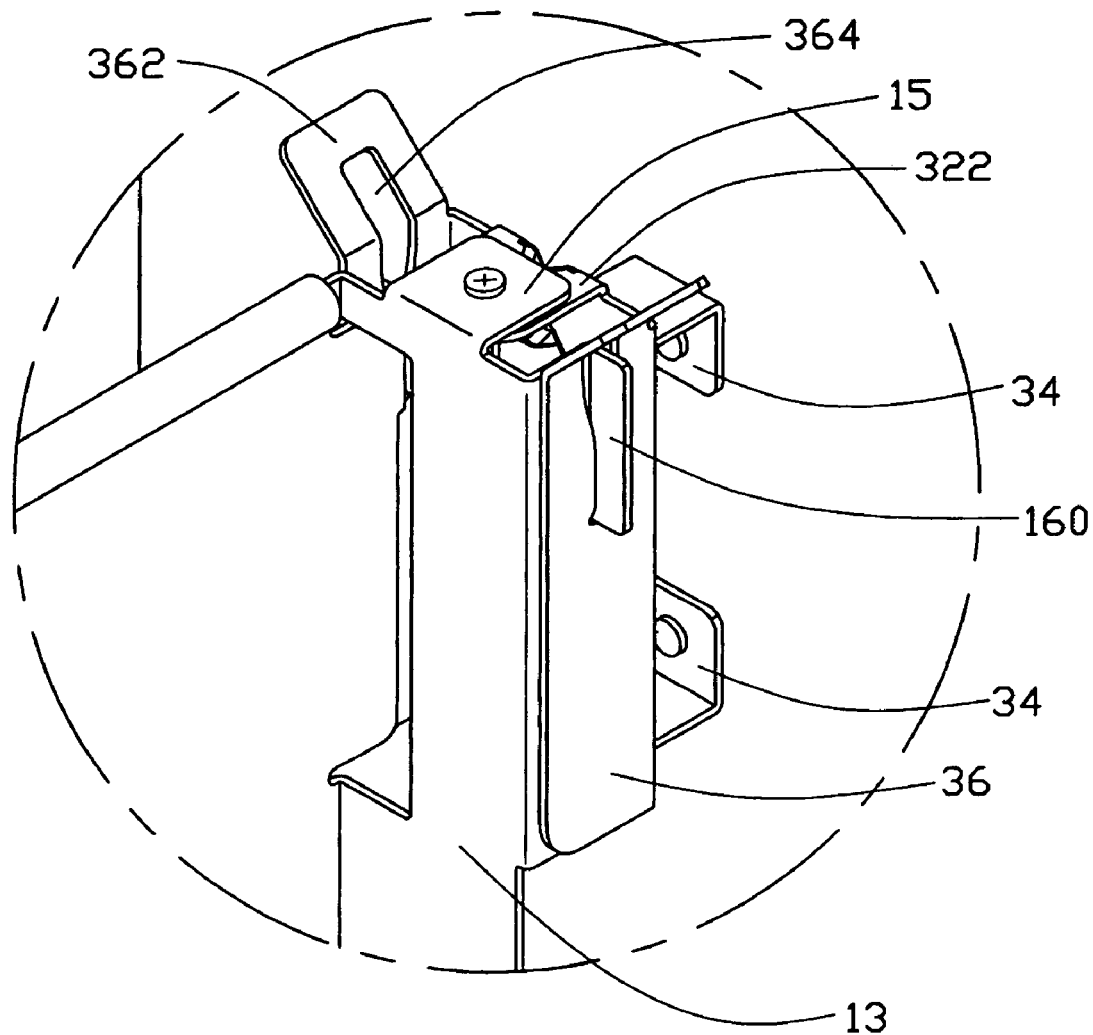
FIG. 5 is an enlarged view of an encircled portion V of FIG. 4.

Referring to FIGS. 4 and 5, in assembly, the mounting frames 30 are attached to inner sides of the side panels 52 of the chassis 50 respectively with the screws 60. The fan 100 is received in the housing 110. The combined fan 100 and housing 110 is attached to the main portion 12 of the mounting bracket 10 at the respective air opening 120, with the spring fingers 112 and clips 116 engaging in the corresponding mounting slots 122. That is, the clips 116 are extended into the mounting slots 122 that are below the air opening 120, and the combined fan 100 and housing 110 is pressed toward the mounting bracket 10 to enable the protrusions 114 of the spring fingers 112 to snappingly engage in the mounting slots 122 that are around the upper portion of the air opening 120.

The mounting bracket 10 is positioned above the mounting frames 30. The first and second plate portions 14, 16 of the mounting portions 13 of the mounting bracket 10 are aligned with the side plates 36 of the mounting frames 30 respectively. The mounting portions 13 are moved down into said spaces of the mounting frames 30, with the first and second plate portions 14, 16 being guided into said spaces by the corresponding guide plates 362 of the side plates 36. The first and second locking tabs 140, 160 enter the upper portions of the corresponding locking slots 364, and are fittingly received in the lower portions of the locking slots 364. During this process, the tapered configurations of the locking slots 364 guide downward movement of the mounting portions 13. The positioning tabs 15 of the mounting portions 13 abut the positioning plates 322 of the mounting frames 322 respectively, with corresponding positioning holes 152, 324 being aligned with each other. Two fasteners (not shown) are extended through the respective aligned positioning holes 152, 324, thereby securing the mounting bracket 10 to the mounting frames 30. The fan 100 is thus secured within the chassis 50. A position of the fan 100 corresponds to an electronic component such as a CPU within the chassis 50 which requires cooling.

In the present invention, the mounting bracket 10 and the mounting frames 30 of the mounting system have relatively simple structures, and can be easily manufactured by multiple stamping processes. This leads to low manufacturing costs. In addition, the mounting frames 30 are attached to the side panels 52 of the chassis 50 by conventional means. Therefore, the mounting system can be readily adapted for use with a variety of different kinds of chassis. Moreover, the guide plates 362 of the mounting frames 30 readily facilitate assembly of the mounting system.

In the preferred embodiment of the present invention, the positioning tabs 15 of the mounting bracket 10 are mounted to the positioning plates 322 of the mounting frames 30 by the two fasteners. In an alternative embodiment, the positioning tabs 15 and positioning plates 322 may be joined together by other suitable means such as snapping inter-engagement means.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A computer component mounting system comprising:
   a chassis comprising a pair of opposite panels;
   a pair of mounting frames attached to the panels respectively, each of the mounting frames comprising a base plate, and a pair of side plates extending from opposite sides of the base plate, the base plate comprising a positioning plate extending therefrom, each of the side plates defining a locking slot therein; and
   a mounting bracket comprising a main portion for holding at least one computer component thereon, and a pair of mounting portions at opposite ends of the main portion, each of the mounting portions comprising a pair of locking tabs corresponding to the locking slots of a respective mounting frame, and a positioning tab corresponding to the positioning plate of the respective mounting frame;
   wherein the locking tabs of the mounting bracket are engaged in the locking slots of the mounting frames, and the positioning tabs of the mounting portions are joined to the respective mounting frames, thereby securing the mounting bracket in the chassis.

2. The computer component mounting system as described in claim 1, wherein each of the mounting frames further comprises a pair of guide plates extending obliquely from upper portions of the side plates respectively.

3. The computer component mounting system as described in claim 2, wherein the locking slot is defined in each of the side plates and its adjoining guide plate.

4. The computer component mounting system as described in claim 3, wherein a width of an upper portion of the locking slot is greater than a width of a lower portion thereof.

5. The computer component mounting system as described in claim 1, wherein each of the mounting frames further comprises a mounting plate extending from the base plate, and the mounting plate defines a mounting hole for attachment of the mounting plate to a corresponding panel of the chassis.

6. The computer component mounting system as described in claim 1, wherein positioning holes are defined in the positioning tabs of the mounting portion and the positioning plates of the mounting frame for extension of fasteners therethrough to join the mounting bracket to the mounting frames.

7. The computer component mounting system as described in claim 1, wherein each of the mounting portions further comprises two opposite plate portions, and the pair of locking tabs extends from the plate portions respectively.

8. The computer component mounting system as described in claim 7, wherein each of the mounting portions is secured between the side plates of a corresponding mounting frame, with the plate portions abutting the side plates.

9. A computer component mounting system comprising:
a pair of panels each with a mounting frame located at an inside thereof, the mounting frame comprising a pair of side plates cooperatively defining a space therebetween, and a medial first positioning member;
a mounting bracket comprising a main portion for holding at least one computer component thereto, and a pair of mounting portions located at opposite ends of the main portion and received in said spaces of the mounting frames respectively, each of the mounting portions comprising a second positioning member corresponding to the first positioning member of a respective mounting frame; and
guiding means provided on each of the mounting frames for guiding the mounting portions into said spaces respectively;
wherein corresponding first and second positioning members are joined together to secure the mounting bracket to the mounting frames, whereby the at least one computer component attached to the mounting bracket is positioned between the panels.

10. The computer component mounting system as described in claim 9, wherein each of the mounting frames further comprises a base plate interconnecting the side plates, and the first positioning member extends from an upper portion of the base plate.

11. The computer component mounting system as described in claim 9, wherein the guiding means comprises a pair of guide plates extending obliquely from upper portions of the side plates of each of the mounting frames.

12. The computer component mounting system as described in claim 11, wherein a pair of locking slots is defined in the side plates and adjoining guide plates of each of the mounting frames, each of the mounting portions comprises a pair of locking tabs, and the locking tabs engage in the locking slots respectively.

13. The computer component mounting system as described in claim 12, wherein a width of an upper portion of each of the locking slots is greater than a width of a lower portion of the locking slot, and the width of the lower portion is substantially equal to a thickness of a corresponding locking tab.

14. The computer component mounting system as described in claim 13, wherein the locking tabs enter the upper portions of the corresponding locking slots, and are fittingly received in the lower portions of the locking slots.

15. The computer component mounting system as described in claim 9, wherein each of the mounting portions further comprises two parallel plate portions that abut the side plates of a corresponding mounting frame when the mounting portion is secured in said space of the mounting frame.

16. The computer component mounting system as described in claim 9, wherein the at least one computer component is received in at least one housing, and the combined at least one computer component and at least one housing is attached to the main portion of the mounting bracket.

17. A computer component mounting system comprising:
at least one panel;
a mounting frame formed on the panel and defining a pair of opposite spaced side plates, each of said side plates defining a locking slot with an opening on a top portion thereof;
a mounting bracket for holding fans thereon, said mounting bracket including:
a main portion located in a non-parallel relation with regard to the panel;
a mounting portion integrally formed and angularly bent at one end of said main portion, said mounting portion confronting and spaced from the panel;
spaced first and second plates located by two sides of the mounting portion, and respectively engaging the corresponding first and second side plates in a direction perpendicular to said first and second plates and side plates;
said first plate being outwardly and angularly split from the mounting portion and leaving an opening therein;
said second plate integrally formed and outwardly angularly bent at a distal end of the mounting portion; and
first and second locking tabs integrally extending angularly and outwardly laterally from corresponding distal ends of the first and second plates, respectively; wherein
each of said first and second locking tabs is retainably received in the corresponding locking slot.

18. The system as described in claim 17, wherein said first parallel plate is coplanar with the main portion.

19. The system as described in claim 17, wherein said main portion is perpendicular to said panel.

20. The system as described in claim 17, wherein said first and second side plates are perpendicular to the panel.

* * * * *